(12) United States Patent
Liu et al.

(10) Patent No.: US 9,763,326 B1
(45) Date of Patent: Sep. 12, 2017

(54) METHODS OF ATTACHING COMPONENTS ON FABRICS USING METAL BRAIDS

(71) Applicant: Flextronics AP, LLC, Broomfield, CO (US)

(72) Inventors: Weifeng Liu, Dublin, CA (US); Zhen Feng, San Jose, CA (US); Anwar Mohammed, San Jose, CA (US)

(73) Assignee: Flextronics AP, LLC, Broomfield, CO (US)

( * ) Notice: Subject to any disclaimer, the term of this patent is extended or adjusted under 35 U.S.C. 154(b) by 0 days.

(21) Appl. No.: 14/304,029

(22) Filed: Jun. 13, 2014

Related U.S. Application Data

(60) Provisional application No. 61/913,830, filed on Dec. 9, 2013.

(51) Int. Cl.
| | |
|---|---|
| *H05K 1/11* | (2006.01) |
| *H05K 1/03* | (2006.01) |
| *A41D 1/00* | (2006.01) |
| *H05K 3/30* | (2006.01) |

(52) U.S. Cl.
CPC ............. *H05K 1/111* (2013.01); *A41D 1/005* (2013.01); *H05K 1/038* (2013.01); *H05K 3/30* (2013.01); *H05K 2201/09418* (2013.01)

(58) Field of Classification Search
CPC ..................................................... A41D 1/002
USPC .............................................. 2/905; 361/760
See application file for complete search history.

(56) References Cited

U.S. PATENT DOCUMENTS

| | | |
|---|---|---|
| 3,471,348 A | 10/1969 | Iles |
| 3,951,493 A | 4/1976 | Kozel |
| 4,733,383 A | 3/1988 | Waterbury |
| 4,956,524 A | 9/1990 | Karkow |
| 5,184,827 A | 2/1993 | Suttle |
| 5,259,833 A | 11/1993 | Barnett |
| 5,555,915 A | 9/1996 | Kanao |
| 5,764,498 A | 6/1998 | Sundstrom |
| 5,777,275 A | 7/1998 | Mizutani et al. |
| 5,778,941 A | 7/1998 | Inada |
| 5,816,848 A | 10/1998 | Zimmerman |
| 5,900,587 A | 5/1999 | Piper |
| 6,103,971 A | 8/2000 | Sato et al. |
| 6,160,254 A | 12/2000 | Zimmerman |

(Continued)

OTHER PUBLICATIONS

Non-final office action, mailed Feb. 10, 2017, U.S. Appl. No. 14/266,636, filed Apr. 30, 2014, Applicant; Weifeng Liu, 30 pages.

(Continued)

*Primary Examiner* — Hoa C Nguyen
*Assistant Examiner* — Stanley Tso
(74) *Attorney, Agent, or Firm* — Haverstock & Owens LLP

(57) ABSTRACT

An electronics assembly includes one or more electronic components coupled to a fabric. Each electronic component includes one or more electrical connection points, such as a bond pad or solder bump. The electronics assembly also includes one or more electrically conductive wire braids, one electrically conductive wire braid coupled to one electrical connection point on an electronic component. The electrically conductive wire braid is stitched to the fabric by an electrically conductive wire, thereby providing an electrical connection between the electronic component and the electrically conductive wire via the electrically conductive wire braid.

24 Claims, 4 Drawing Sheets

(56) References Cited

U.S. PATENT DOCUMENTS

| | | | |
|---|---|---|---|
| 6,172,344 B1 * | 1/2001 | Gordon et al. | 219/529 |
| 6,192,940 B1 | 2/2001 | Koma et al. | |
| 6,339,193 B1 * | 1/2002 | Goett et al. | 174/78 |
| 6,349,201 B1 | 2/2002 | Ford | |
| 6,714,431 B2 | 3/2004 | Gamini et al. | |
| 6,743,982 B2 | 6/2004 | Biegelsen et al. | |
| 6,797,881 B2 | 9/2004 | Nakamura | |
| 7,019,973 B2 | 3/2006 | Rivera | |
| 7,156,127 B2 | 1/2007 | Moulton et al. | |
| 7,191,803 B2 | 3/2007 | Orr et al. | |
| 7,234,831 B1 * | 6/2007 | Hanley | 362/106 |
| 7,319,895 B2 | 1/2008 | Klefstad-Sillonville | |
| 7,491,892 B2 | 2/2009 | Wagner et al. | |
| 7,573,727 B2 | 8/2009 | Hauenstein | |
| 7,629,691 B2 | 12/2009 | Roush et al. | |
| 7,735,523 B2 | 6/2010 | Smith et al. | |
| 7,795,540 B2 | 9/2010 | Yamada et al. | |
| 8,157,730 B2 | 4/2012 | Le Boeuf | |
| 8,207,473 B2 | 6/2012 | Axisa et al. | |
| 8,258,011 B2 | 9/2012 | Brun | |
| 8,283,602 B2 * | 10/2012 | Augustine et al. | 219/212 |
| 8,467,726 B2 | 6/2013 | Shirakata | |
| 8,469,741 B2 | 6/2013 | Oster | |
| 8,861,220 B2 | 10/2014 | Loher | |
| 9,018,532 B2 | 4/2015 | Wesselmann | |
| 2002/0094701 A1 | 7/2002 | Biegelsen | |
| 2003/0093248 A1 | 5/2003 | Vock | |
| 2003/0098084 A1 | 5/2003 | Ragner et al. | |
| 2003/0111126 A1 | 6/2003 | Moulton et al. | |
| 2003/0127246 A1 | 7/2003 | Watanabe | |
| 2003/0129905 A1 | 7/2003 | Dhawan et al. | |
| 2004/0111045 A1 | 6/2004 | Sullivan | |
| 2004/0229533 A1 | 11/2004 | Braekevelt | |
| 2004/0259391 A1 | 12/2004 | Jung | |
| 2005/0022338 A1 | 2/2005 | Muhlenkamp | |
| 2005/0154264 A1 | 7/2005 | Lecompte | |
| 2005/0224993 A1 * | 10/2005 | Manepalli et al. | 257/787 |
| 2005/0280157 A1 | 12/2005 | Roush | |
| 2006/0000633 A1 | 1/2006 | Hopper | |
| 2006/0035554 A1 | 2/2006 | Glaser et al. | |
| 2006/0254811 A1 | 11/2006 | Kirstein | |
| 2006/0282018 A1 | 12/2006 | Balzano | |
| 2007/0001844 A1 * | 1/2007 | Krill | 340/545.1 |
| 2007/0054511 A1 | 3/2007 | Ittel | |
| 2007/0125295 A1 | 6/2007 | Sanguinetti | |
| 2007/0190881 A1 | 8/2007 | Shibaoka et al. | |
| 2007/0232455 A1 | 10/2007 | Hanoun | |
| 2007/0290305 A1 | 12/2007 | Oyama | |
| 2008/0060873 A1 | 3/2008 | Lang | |
| 2008/0157235 A1 | 7/2008 | Rogers | |
| 2008/0182475 A1 | 7/2008 | Gnade | |
| 2008/0223844 A1 | 9/2008 | Cronn | |
| 2008/0258314 A1 | 10/2008 | Yoo | |
| 2009/0173529 A1 | 7/2009 | Lee | |
| 2009/0309739 A1 | 12/2009 | Ezer | |
| 2009/0317639 A1 | 12/2009 | Axisa | |
| 2010/0090834 A1 | 4/2010 | Buchnick | |
| 2011/0063098 A1 | 3/2011 | Fischer | |
| 2011/0130060 A1 | 6/2011 | Chung et al. | |
| 2011/0175630 A1 | 7/2011 | Bhattacharya | |
| 2011/0245633 A1 | 10/2011 | Goldberg | |
| 2012/0050036 A1 | 3/2012 | Landry | |
| 2012/0051005 A1 | 3/2012 | Vanfleteren | |
| 2012/0176764 A1 | 7/2012 | Loher | |
| 2012/0279762 A1 | 11/2012 | Hur | |
| 2012/0314382 A1 | 12/2012 | Wesselmann | |
| 2013/0183646 A1 | 7/2013 | Lusted | |
| 2013/0216065 A1 | 8/2013 | Nguyen | |
| 2014/0124257 A1 | 5/2014 | Yoshihara | |
| 2014/0275857 A1 | 9/2014 | Toth | |
| 2014/0299362 A1 | 10/2014 | Park | |
| 2014/0362020 A1 | 12/2014 | Rothkopf | |
| 2015/0009129 A1 | 1/2015 | Song | |
| 2015/0065840 A1 | 3/2015 | Bailey | |
| 2015/0091711 A1 | 4/2015 | Kosonen | |
| 2015/0109124 A1 | 4/2015 | He | |
| 2015/0185944 A1 | 7/2015 | Magi | |
| 2015/0245777 A1 | 9/2015 | Della | |
| 2015/0312653 A1 | 10/2015 | Avrahami | |
| 2016/0020500 A1 | 1/2016 | Matsuda | |
| 2016/0034634 A9 | 2/2016 | Hong | |
| 2016/0187122 A1 | 6/2016 | Krimon | |

OTHER PUBLICATIONS

Office Action, U.S. Appl. No. 15/081,794, filed Mar. 25, 2016, Applicant: Michael James Glickman, Mail date: Apr. 5, 2017, 18 pages.

* cited by examiner

METHODS OF ATTACHING COMPONENTS ON FABRICS USING METAL BRAIDS

RELATED APPLICATIONS

This Patent Application claims priority under 35 U.S.C. 119 (e) of the U.S. Provisional Application, Ser. No. 61/913,830, filed Dec. 9, 2013, and entitled "METAL FABRIC STITCHING AND STRETCHABLE BATTERIES". This application incorporates U.S. Provisional Application, Ser. No. 61/913,830 in its entirety by reference.

FIELD OF THE INVENTION

The present invention is generally directed to the field of wearable electronics. More specifically, the present invention is directed to wearable electronics fabric having an electronic component with electrical connectivity provided by stitched electrically conductive wire and metal wire braid.

BACKGROUND OF THE INVENTION

Electronic devices are increasingly being developed so as to be worn by a user, such as in wearable electronics. Many wearable electronics are designed as stand alone devices having an electronic component attached to band that is used for securing the device to a user, such as a wristwatch having a wrist-band or a heart-rate monitor having a band that wraps around a users chest. The electronic component of such devices often includes a housing with an integrated clasp or securing means for attaching to the band. Adhesive can also be used to secure the electronic component to the band. Instead of stand-alone devices, other wearable electronics are being integrated with clothing. Adhesives can also be used in these applications to secure the electronic component to a clothing fabric.

Metal wires are commonly used as electrical conductors between electronic devices. As applied to wearable electronics, providing electrical connectivity to or between one or more worn electrical devices is typically done using a separate electrical cable that includes a metal wire. However, having loose cables is often a nuisance and ungainly.

SUMMARY OF THE INVENTION

Embodiments of an electronics assembly are directed to one or more electronic components coupled to a fabric. Each of the one or more electronic components includes one or more electrical connection points, such as a bond pad or solder bump. The electronics assembly also includes one or more electrically conductive wire braids, one electrically conductive wire braid coupled to one electrical connection point on an electronic component. The electrically conductive wire braid includes a plurality of individual electrically conductive wires braided together. The electrically conductive wire braid is stitched to the fabric by an electrically conductive wire, thereby providing an electrical connection between the electronic component and the electrically conductive wire via the electrically conductive wire braid. In some embodiments, the electrically conductive wire braid is attached to the fabric by an adhesive. In other embodiments, the electrically conductive wire braid is attached to the fabric using a stitched thread, which can be either electrically insulated thread or another electrically conductive wire. In some embodiments, the fabric is a electronics fabric having one or more insulated wires woven into the fabric. In some embodiments, the insulated wire includes an inner metal wire and an outer insulation layer. The electrically conductive wire stitched to the fabric and to the electrically conductive wire braid can also be electrically coupled to the metal wire within the insulated wire of the fabric. In some embodiments, the fabric is a wearable fabric, such as a shirt or pants, or other form to be worn by a user, such as an armband, waistband, hat or shoes.

In an aspect, an electronics assembly is disclosed which includes a fabric, an electronic component, an electrically conductive wire braid and an electrically conductive wire. The electronic component includes an electrical connection point. The electrically conductive wire braid is coupled to the electrical connection point of the electronic component, wherein an electrical connection is formed between the electrically conductive wire braid and the electrical connection point. The electrically conductive wire is stitched to the fabric and to the electrically conductive wire braid such that an electrical connection is formed between the electrically conductive wire and the electrically conductive wire braid. In some embodiments, the electrical connection point is a bond pad. In other embodiments, the electrical connection point is a solder bump. In some embodiments, the electrical connection point is coupled to the electrically conductive wire braid via a solder joint, a welded joint or an electrically conductive adhesive. In some embodiments, the electrically conductive wire braid is coupled to the fabric using an adhesive. In other embodiments, the electrically conductive wire braid is coupled to the fabric using a stitched non-electrically conductive thread. In still other embodiments, the electrically conductive wire braid is coupled to the fabric using a second electrically conductive thread stitched to the fabric and to the electrically conductive wire braid. In some embodiments, the electrically conductive wire braid includes a plurality of electrically conductive wires. Each of the plurality of electrically conductive wires can be a metal wire made of one or more of copper, silver, nickel and their alloys. Each of the plurality of electrically conductive wires can include an electrically conductive plating finish. Each of the plurality of electrically conductive wires can be an electrically conductive polymer. In some embodiments, the electrically conductive wire braid includes a plurality of electrically conductive wires braided together. In some embodiments, the electronics assembly also includes an encapsulation layer coupled to the electronics component, the electrically conductive wire braid and the electrically conductive wire. In some embodiments, the fabric includes an insulated wire including an inner metal wire and an outer insulation layer, wherein the electrically conductive wire is electrically coupled to the inner metal wire of the insulated wire. In some embodiments, the electrically conductive wire stitched to the fabric includes two separate wires, wherein the two separate wires include a metal wire and an insulation wire. In some embodiments, the electronics assembly is wearable.

In another aspect, a method of making an electronics assembly is disclosed. The method includes attaching an electrical connection point of an electronic component to an electrically conductive wire braid, thereby forming an electrical connection between the electrically conductive wire braid and the electrical connection point. The method also includes attaching the electrically conductive wire braid to a fabric, and stitching an electrically conductive wire to the fabric and to the electrically conductive wire braid such that an electrical connection is formed between the electrically conductive wire and the electrically conductive wire braid. In some embodiments, attaching the electrical connection point of the electronic component to the electrically conductive wire braid includes soldering, welding or using an electrically conductive adhesive. In some embodiments, attaching the electrically conductive wire braid to the fabric includes using an adhesive. In other embodiments, attaching the electrically conductive wire braid to the fabric includes stitching a non-electrically conductive thread to the electrically conductive wire braid and to the fabric. In still other embodiments, attaching the electrically conductive wire braid to the fabric includes stitching a second electrically conductive thread to the electrically conductive wire braid and to the fabric. In some embodiments, the method also includes adding an encapsulation layer coupled to the electronics component, the electrically conductive wire braid and the electrically conductive wire. In some embodiments, the fabric includes an insulated wire including an inner metal wire and an outer insulation layer, and the method further comprises electrically coupling the electrically conductive wire to the inner metal wire of the insulated wire. In some embodiments, the electrically conductive wire stitched to the fabric includes two separate wires, wherein the two separate wires include a metal wire and an insulation wire, and stitching the electrically conductive wire to the fabric includes stitching the two separate wires. In some embodiments, the electronics assembly is wearable.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to an electronic component coupled to a fabric and methods of attaching the electronic component to the fabric. Those of ordinary skill in the art will realize that the following detailed description of the products and methods are illustrative only and is not intended to be in any way limiting. Other embodiments of the products and methods will readily suggest themselves to such skilled persons having the benefit of this disclosure.

Reference will now be made in detail to implementations of the products and methods as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
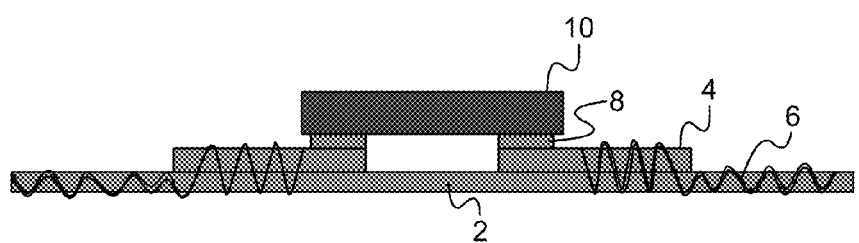
FIG. 1 illustrates a cut out side view of an electronic component coupled to a fabric according to an embodiment.

FIG. 1 illustrates a cut out side view of an electronic component coupled to a fabric according to an embodiment. As used herein, the term "fabric" generally applies to cloth or other similar materials made of threads, fibers, filaments or the like, generally referred to herein as "threads". Materials used for threads can include, but are not limited to, cotton, wool, nylon, polyester or other synthetic materials. An electronic component 10 is coupled to a fabric 2 via one or more electrically conductive wire braids 4. The electronic component 10 can be any conventional electronic component including, but not limited to, an active electronic component such as an integrated circuit, a passive electronic component such as a resistor, a capacitor and an inductor, and a power supply.

Off-component electrical connectivity can be provided by electrical connection points, such as electrical connection point 8. In the exemplary configuration shown in FIG. 1, the electronic component 10 includes two electrical connection points 8. It is understood that the electronic component can include more or less than two electrical connection points, and that the electrical connection points can be alternatively positioned than that shown in FIG. 1. Examples of electrical connection points include, but are not limited to, bond pads and solder bumps. It is understood that other types of conventional electrical connection points can be used. In some embodiments, there is one electrically conductive wire braid 4 coupled to each electrical connection point 8. The wire braid 4 can be attached by soldering, welding or using electrically conductive adhesive. It is understood that other conventional methods can be used to provide a mechanical and electrical connection between the electrical connection point and the wire braid.

As shown in FIG. 1, a first portion of the wire braid 4 is coupled to the electrical connection point 8 of the electronic component 10, and a second portion of the wire braid 4 extends beyond a footprint of the electronic component 10. The second portion of the wire braid 4 is stitched to the fabric 2 using an electrically conductive stitched wire 6.

Figure 2:
FIG. 2 illustrates a top down view of the wire braid of FIG. 1 according to an embodiment.

In some embodiments, the wire braid is made of a plurality of electrically conductive wires braided together. FIG. 2 illustrates a top down view of the wire braid 4 of FIG. 1 according to an embodiment. The wire braid 4 is made of a plurality of electrically conductive wires 16 braided together. In some embodiments, the electrically conductive wires 16 are metal wires. Examples of such metal wires include, but are not limited to, copper, silver, steel, nickel, and their alloys. In some embodiments, the metal wires are coated with a plating finish to protect from corrosion and enhance electrical conductivity. Examples of such plating finish include, but are not limited to, gold flash over nickel, silver, or solder. In some embodiments, the electrically conductive wires 16 are electrically conductive polymers. Examples of such electrically conductive polymers include, but are not limited to, silver coated nylon yarn and carbon embedded yarn. The gauge of the wire can vary by application. In general, the gauge and density of the electrically conductive wires 16 is configured to enable a stitching needle to penetrate between adjacent electrically conductive wires. Further, the geometry of the wire braid 4 can vary by application. In the exemplary configuration shown in FIG. 2, the wire braid 4 is a strand. It is understood that the wire braid can be alternatively shaped. It is also understood that the braiding pattern formed by the plurality of electrically conductive wires can vary from that shown in FIG. 2. In some embodiments, the wire braid is a desoldering metal braid, also called a solder wick or desolder wick, which is a braid made of copper wire and the braid is coated with rosin flux.

Referring again to FIG. 1, the stitched wire 6 is coupled to the wire braid 4 and to the fabric 2 with sufficient force to provide an electrical connection between the wire braid 4 and the stitched wire 6. Although the primary function of the stitched wire 6 is to provide electrical connection to the wire braid 4, the stitched wire 6 provides a secondary function of securing the wire braid 4 to the fabric 2. However, in some embodiments, the stitched wire 6 is stitched to only a small area of the wire braid 4. Attaching a larger area of the wire braid 4 to the fabric 2 is typically advisable for increased durability and long term attachment. In some embodiments, the wire braid 4 is coupled to the fabric 2 by an adhesive. The adhesive can be any conventional adhesive sufficient to adhere a wire braid to a fabric, such as an epoxy or glue. In some embodiments, the adhesive is selectively applied such that none of the stitched wire passes through adhesive. In other embodiments, the wire braid 4 is coupled to the fabric 2 by another stitched thread, which can be either electrically conductive or electrically insulated. This stitched thread can be applied over a greater area of the wire braid 4 than the stitched wire 6. For example the stitched thread can be applied around a perimeter of the wire braid 4.

In some embodiments, the stitched wire 6 is stitched using any conventional stitching process that uses two threads. In this case, the stitched wire 6 includes two wires, a first wire is electrically conductive and a second wire, a bobbin wire, is electrically insulated so that the two wires do not short together. In some embodiments, the first wire is made of electrically conductive material such as metal, carbon fiber, nylon wire coated with silver finish, or metal particles embedded polymer wire. Examples of metal wire include, but are not limited to, copper, silver, steel, nickel or their alloys. The metal wire can also be coated with different finishes such as gold flash over nickel, silver or solder. In some embodiments, the second wire is made of electrically insulated material such as nylon or polyester. It is understood that alternative electrically conductive materials can be used for the first wire and alternative electrically insulated materials can be used for the second wire. For simplicity, the stitched wire is generally referred to herein as being electrically conductive, even in those configurations where a second insulated wire is used in the stitching process.

Figure 3:
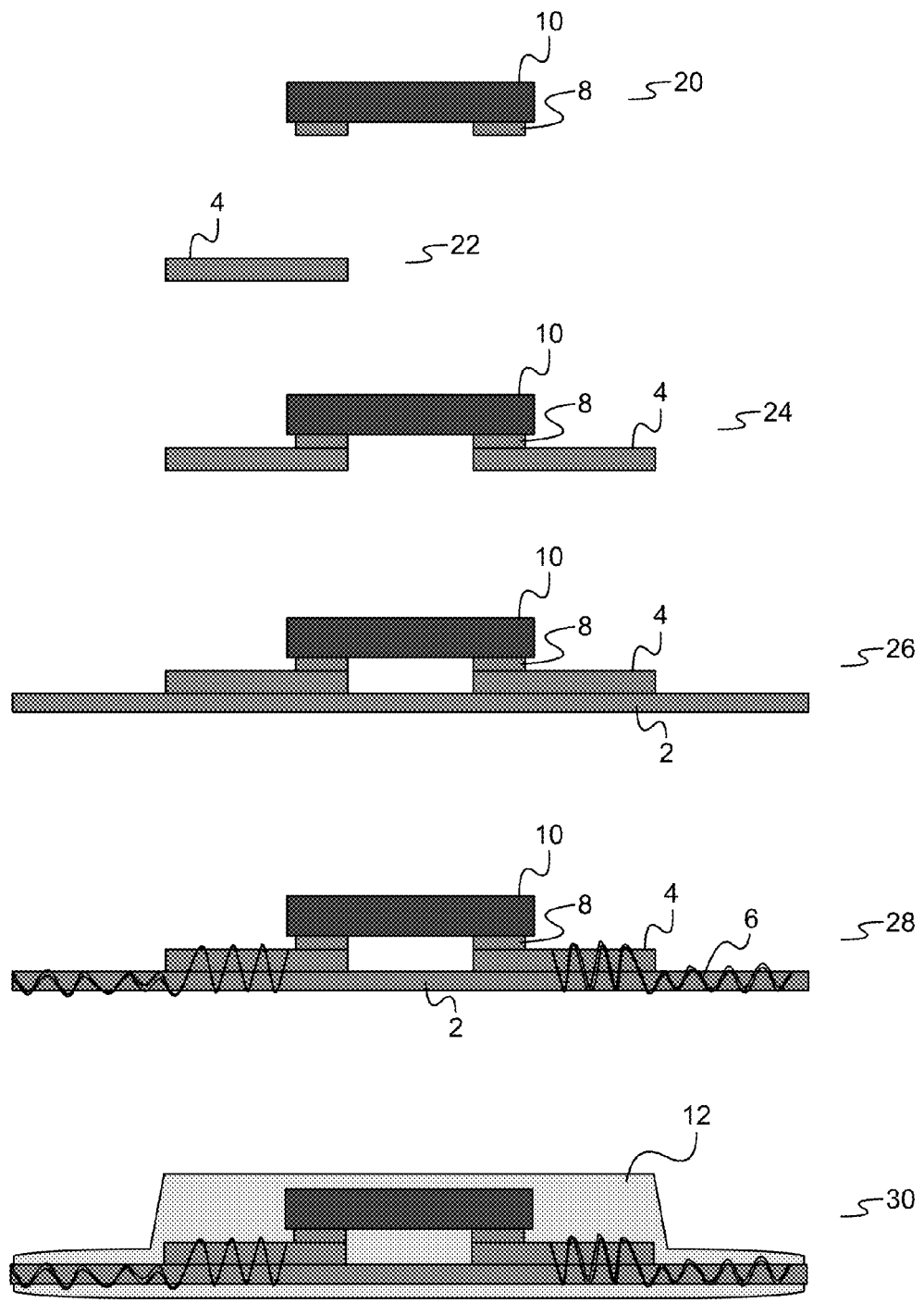
FIG. 3 illustrates a method of making an electronics assembly according to an embodiment.
Figure 4:
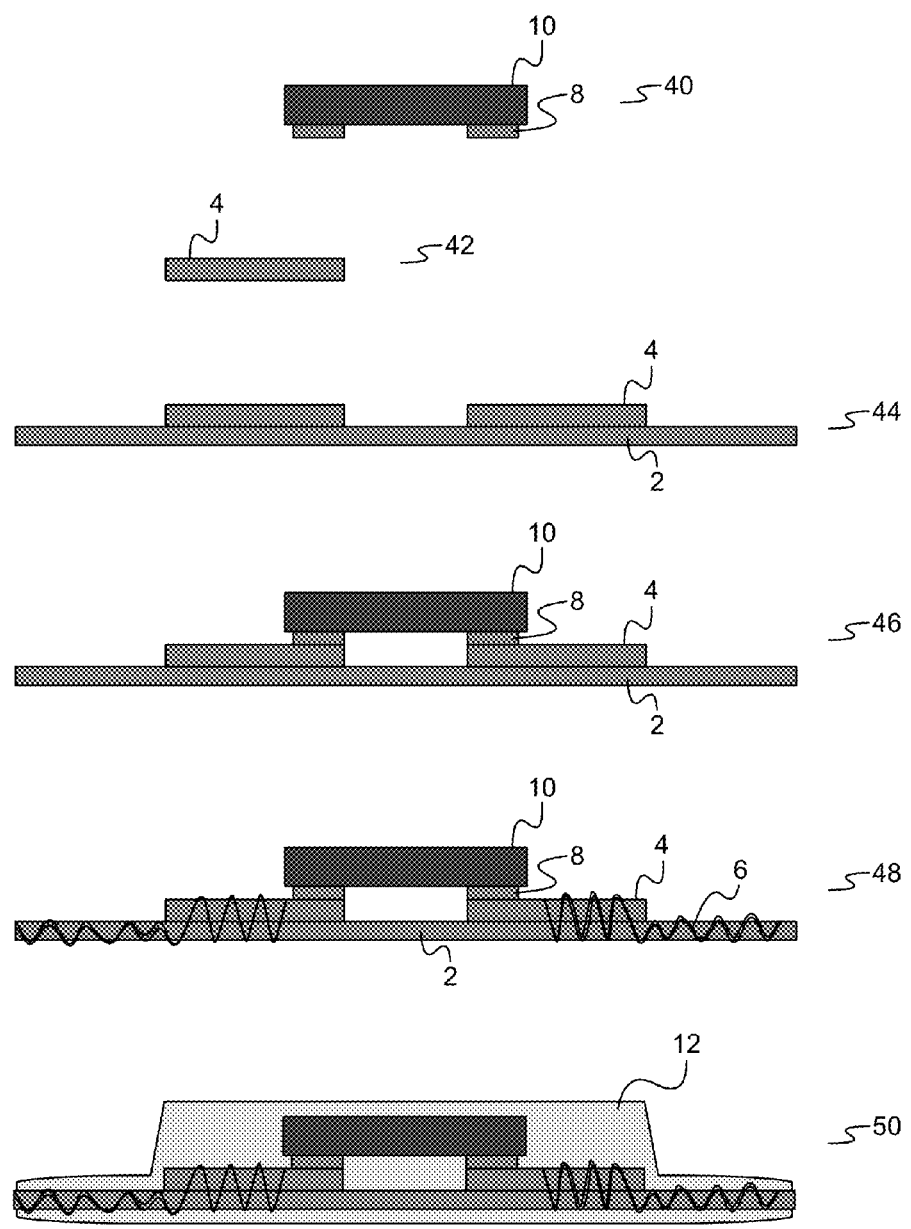
FIG. 4 illustrates another method of making an electronics assembly according to an embodiment.
Figure 5:
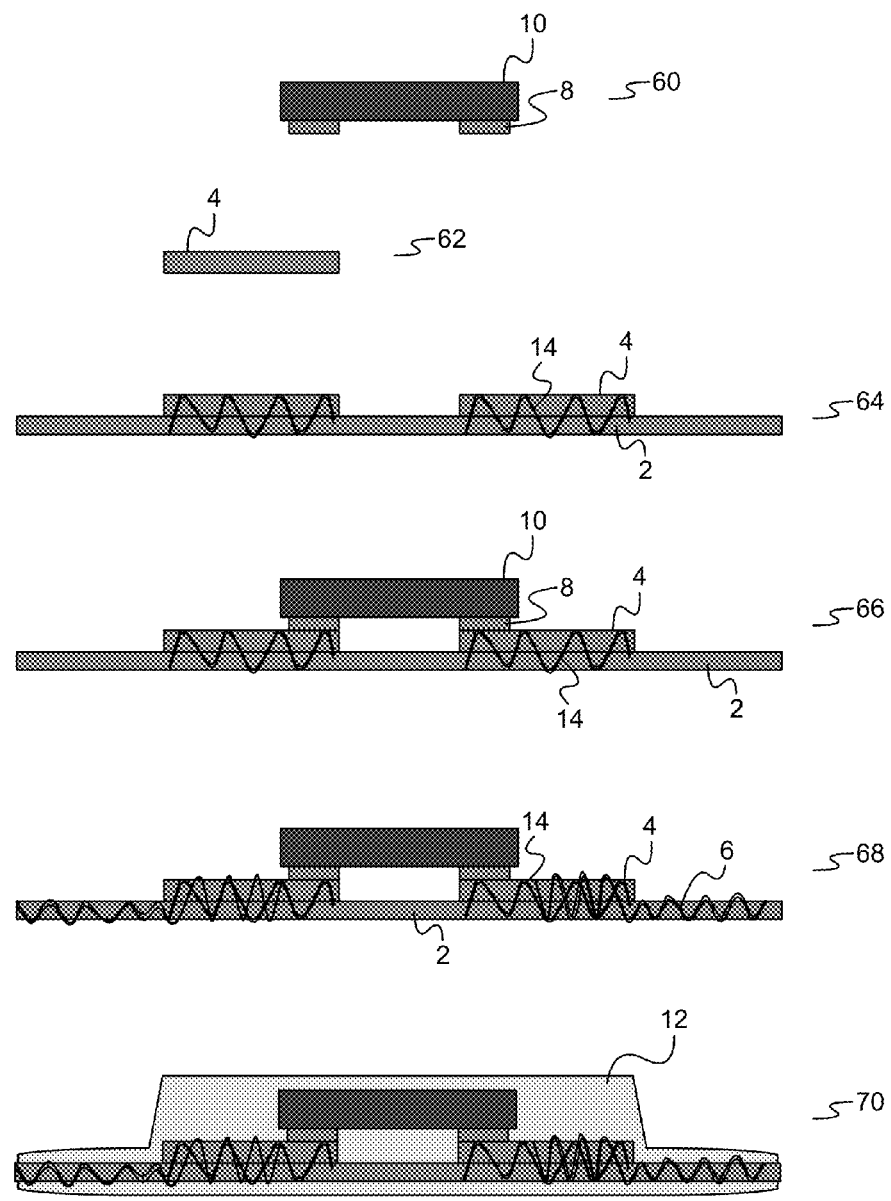
FIG. 5 illustrates yet another method of making an electronics assembly according to an embodiment.

In some embodiments, an encapsulation layer is added over the electronic component 10, the wire braid 4 and the stitched wire 6, such as an encapsulation layer 12 shown in FIG. 3-5. A backside encapsulation layer is also added over the stitched wire 6 on the backside of the fabric 2. In some embodiments, the encapsulation layer is an elastic material, such as an elastic polymer, or elastomer, which is a polymer with viscoelasticity. It is understood that alternative elastic substrates can be used including, but not limited to, silicone, urethane, latex and spandex, also referred to as elastane. The encapsulation layer provides environmental protection as well as electrical isolation of individual electrical connection points and wires.

The number and positions of the electrical connection points and corresponding wire braid extending from the electronic component varies by application. One or more wire braids can extend laterally from the electronic component in any direction. One or more stitches can be used to stitch electrically conductive wire to any given wire braid. The number and placement of electrically conductive wire stitches per wire braid can vary. For example, the wire braid 4 shown in FIG. 1 has three stitches of the electrically conductive wire 6. It is understood that there can be more or less than three stitches.

In some embodiments, the fabric includes one or more insulated wires intermixed with the fabric threads. An example of a fabric having intermixed insulated wires is found in the co-pending U.S. patent application Ser. No. 14/194,497, titled "Magnet Wire for Wearable Electronics Fabric", which is hereby incorporated in its entirety by reference. In some embodiments, the insulated wire includes an inner metal wire and an outer insulation layer. In some embodiments, the electrically conductive wire stitched to the wire braid is also electrically coupled to the metal wire within the insulated wire of the fabric. The insulation layer can be selectively removed, such as by using a laser, to expose the metal wire for electrical connectivity.

As used herein, the term "intermix" generally refers to mixing or blending together and is applied herein to describe the manner by which an insulated wire, such as a magnet wire, is integrated as part of a fabric. The magnet wire is intermixed with the fabric using conventional methodologies, for example weaving, stitching, felting or knitting, and is intended to include, but not be limited to, such similar concepts as intertwining, interweaving, interspersing, interlacing, intermingling and the like of the magnet wire and fabric threads.

Magnet wire is typically made of a copper or aluminum wire coated with a very thin layer of insulation. Magnet wire is referred to as "magnet" due to its electromagnetic applications. Magnet wires can be used in the construction of transformers, inductors, motors, speakers, hard disk head actuators, potentiometers, electromagnets, and other applications which require tight coils of wire. The metal wire itself is most often fully annealed, electrolytically refined copper. Smaller diameter magnet wire usually has a round cross section. An example of this kind of wire is used for things such as electric guitar pickups. Thicker magnet wire is often square or rectangular with rounded corners to provide more current flow per coil length.

In some embodiments, magnet wire includes one to four layers of polymer film insulation, often of two different compositions, to provide a tough, continuous insulating layer. Materials used for magnet wire insulating films can include, but are not limited to, polyvinyl formal (Formvar™), polyurethane, polyamide, polyester, polyester-polyimide, polyamide-polyimide (or amide-imide), and polyimide. Polyimide insulated magnet wire is capable of operation at up to 250° C. In other embodiments, different types of insulation are used including, but not limited to, fiberglass yarn with varnish, aramid paper, kraft paper, mica, and polyester film. It is understood that are types of magnet wires can be used, for example a silver wire having various insulators, such as polytetrafluoroethylene (Teflon™), such as that found in the audio industry. For ease of manufacturing, newer magnet wires can have insulation that acts as a flux when burnt during soldering. This results in magnet wires having electrical connections at the ends that can be made without stripping off the insulation first. Older magnet wires do not have this type of insulation and can require sandpapering or scraping to remove the insulation before soldering.

There are various methodologies of making the electronic assembly including the electronics component, the wire braid and the fabric. FIG. 3 illustrates a method of making an electronics assembly according to an embodiment. For exemplary purposes, the method of FIG. 3 is described in terms of the electronic assembly of FIG. 1. At the step 20, the electronic component 10 is obtained. The electronic component includes one or more electrical connection points. In the exemplary case of the electronic component 10, there are two electrical connection points 8.

At the step 22, the electrically conductive wire braid 4 is obtained. In the exemplary case where there are two electrical connection points 8, there are two separate wires braids 4, one for each electrical connection point 8. In some embodiments, a long strand of wire braid is cut into individual wire braids. Each wire braid 4 can be selectively formed into application specific shapes based on design requirements and constraints.

At the step 24, one wire braid 4 is attached to one electrical connection point 8. The wire braid 4 can be attached by soldering, welding or using electrically conductive adhesive. It is understood that other conventional methods can be used to provide a mechanical and electrical connection between the electrical connection point and the wire braid. The wire braid 4 is shaped and attached such that once attached to the electrical connection point a portion of the wire braid extends laterally beyond a footprint of the electronic component 10.

At the step 26, the wire braids 4 are attached to the fabric 2. In some embodiments, the wire braids 4 are attached to the fabric 2 using an adhesive, which can be pre-applied to the wire braids 4, the fabric 2 or both. In some embodiments, a curing step is performed to secure the wire braids 4 and the fabric 2 to the adhesive.

At the step 28, each wire braid 4 is stitched to the fabric 2 using stitched electrically conductive wire 6. An optional additional step can be performed where the stitched electrically conductive wire 6 is electrically coupled to an insulated wire (not shown) intermixed in the fabric 2. Another optional additional step can be performed wherein a first end of the stitched electrically conductive wire 6 is stitched to the wire braid 4, as shown in FIG. 3, and a second end of the stitched electrically conductive wire 6 is stitched to another wire braid (not shown), where this other wire braid can be coupled to the electrical connection point of a different electronic component.

At the step 30, an encapsulation layer 12 is added over the electronic component 10, the wire braids 4 and the stitched electrically conductive wires 6.

Steps 24 and 26 are shown as attaching the wire braids 4 to the electrical connection points 8 prior to attaching the wire braids 4 to the fabric 2. This process can be reversed. FIG. 4 illustrates another method of making an electronics assembly according to an embodiment. The method of FIG. 4 is similar to that of the method of FIG. 3 except that the wire braids 4 are first attached to the fabric 2, then the electrical connection points 8 are attached to the wire braids 4. Specifically, at the step 40, the electronic component 10 is obtained. At the step 42, the electrically conductive wire braids 4 are obtained. At the step 44, the wire braids 4 are attached to the fabric 2. In some embodiments, the wire braids 4 are attached to the fabric 2 using an adhesive, which can be pre-applied to the wire braids 4, the fabric 2 or both. In some embodiments, a curing step is performed to secure the wire braids 4 and the fabric 2 to the adhesive.

At the step 46, the electronic component 10 is attached to the wire braids 4 such that one electrical connection point 8 is attached to a corresponding one wire braid 4. The wire braids 4 can be attached by soldering, welding or using electrically conductive adhesive. In some applications, the fabric 2 may be made of material that would be damaged at typical soldering temperatures. In these cases, localized heating can be used to avoid damaging the fabric. For example, laser soldering can be performed where the electrodes of the electronic component 10 are heated. It is understood that other conventional methods can be used to provide a mechanical and electrical connection between the electrical connection point and the wire braid. Each wire braid 4 is shaped and attached such that once attached to the electrical connection point a portion of the wire braid extends laterally beyond a footprint of the electronic component 10.

At the step 48, each wire braid 4 is stitched to the fabric 2 using stitched electrically conductive wire 6. An optional additional step can be performed where the stitched electrically conductive wire 6 is electrically coupled to an insulated wire (not shown) intermixed in the fabric 2. Another optional additional step can be performed wherein a first end of the stitched electrically conductive wire 6 is stitched to the wire braid 4, as shown in FIG. 4, and a second end of the stitched electrically conductive wire 6 is stitched to another wire braid (not shown), where this other wire braid can be coupled to the electrical connection point of a different electronic component.

At the step 50, the encapsulation layer 12 is added over the electronic component 10, the wire braids 4 and the stitched electrically conductive wires 6.

It is understood that the wire braids 4 can be attached to the fabric using alternative conventional attachment means. FIG. 5 illustrates yet another method of making an electronics assembly according to an embodiment. The method of FIG. 5 is similar to that of the method of FIG. 4 except that each wire braid is attached to the fabric by using a stitched thread. Specifically, at the step 60, the electronic component 10 is obtained. At the step 62, the electrically conductive wire braids 4 are obtained. At the step 64, the wire braids 4 are attached to the fabric 2. Each wire braid 4 is stitched to the fabric 2 using a stitched thread 14, which can be electrically conductive or electrically insulated. This stitched thread can be applied over a greater area of the wire braid 4 than the stitched wire 6. For example, a stitched thread can be applied around a perimeter of each wire braid 4.

At the step 66, the electronic component 10 is attached to the wire braids 4 such that one electrical connection point 8 is attached to a corresponding one wire braid 4. The wire braid 4 can be attached by soldering, welding or using electrically conductive adhesive. It is understood that other conventional methods can be used to provide a mechanical and electrical connection between the electrical connection point and the wire braid. The wire braid 4 is shaped and attached such that once attached to the electrical connection point a portion of the wire braid extends laterally beyond a footprint of the electronic component 10.

At the step 68, each wire braid 4 is stitched to the fabric 2 using stitched electrically conductive wire 6. Portions of the stitched electrically conductive wire 6 and the stitched thread 14 may overlap. An optional additional step can be performed where the stitched electrically conductive wire 6 is electrically coupled to an insulated wire (not shown) intermixed in the fabric 2. Another optional additional step can be performed wherein a first end of the stitched electrically conductive wire 6 is stitched to the wire braid 4, as shown in FIG. 5, and a second end of the stitched electrically conductive wire 6 is stitched to another wire braid (not shown), where this other wire braid can be coupled to the electrical connection point of a different electronic component.

At the step 70, the encapsulation layer 12 is added over the electronic component 10, the wire braids 4 and the stitched electrically conductive wires 6. If the stitched thread 14 is electrically conductive, then the encapsulation layer 12 is also added over the stitched thread 14.

The exemplary configurations described above are directed to a single electronic component coupled to the fabric. It is understood that alternative configurations are configured that include more than one electronic component coupled to the fabric. In such embodiments, the stitched electrically conductive wire can be used to connect multiple electronic components, or to intervening insulated wires woven into the fabric, which in turn may be electrically coupled to other electronic components via stitched electrically conductive wires.

Although embodiments of the electronics assembly are described above as wearable electronics assembly, the general concepts described herein can be applied generally to electronics coupled to fabrics, wearable or otherwise.

The present application has been described in terms of specific embodiments incorporating details to facilitate the understanding of the principles of construction and operation of the products and methods. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. An electronics assembly comprising:
   a. a fabric;
   b. an electronic component comprising first and second electrical connection points;
   c. first and second electrically conductive wire braids, the first electrically conductive wire braid coupled to and in contact with the first electrical connection point of the electronic component and positioned between the fabric and the first electrical connection point, wherein a first direct electrical connection is formed between the first electrically conductive wire braid and the first electrical connection point, and the second electrically conductive wire braid coupled to and in contact with the second electrical connection point of the electronic component and positioned between the fabric and the second electrical connection point, wherein a second direct electrical connection is formed between the second electrically conductive wire braid and the second electrical connection point;
   d. first and second electrically conductive wires stitched to the fabric and to the respective first and second electrically conductive wire braids such that a first electrical connection is formed between the first electrically conductive wire and the first electrically conductive wire braid, wherein the first electrically conductive wire is stitched to the fabric and to the first electrically conductive wire braid without the first electrically conductive wire physically contacting the electronic component and the first electrical connection point and such that a second electrical connection is formed between the second electrically conductive wire and the second electrically conductive wire braid, wherein the second electrically conductive wire is stitched to the fabric and to the second electrically conductive wire braid without the second electrically conductive wire physically contacting the electronic component and the second electrical connection point;
   e. wherein each of the first and second electrically conductive wires comprises two separate wires, wherein the two separate wires comprise a metal wire and an insulation wire;
   f. wherein the fabric comprises an insulated wire including an inner metal magnet wire and an outer insulation layer; and
   g. wherein the first electrically conductive wire is electrically coupled to the inner metal magnet wire of the insulated wire.

2. The electronics assembly of claim 1 wherein each of the first and second electrical connection points comprises a bond pad physically contacting the electronic component.

3. The electronics assembly of claim 1 wherein each of the first and second electrical connection points comprises a solder bump physically contacting the electronic component.

4. The electronics assembly of claim 1 wherein each of the first and second electrical connection points is coupled to the respective first and second electrically conductive wire braids via a solder joint, a welded joint or an electrically conductive adhesive.

5. The electronics assembly of claim 1 wherein each of the first and second electrically conductive wire braids is coupled to the fabric using an adhesive.

6. The electronics assembly of claim 1 wherein each of the first and second electrically conductive wire braids is coupled to the fabric using respective first and second stitched non-electrically conductive threads.

7. The electronics assembly of claim 1 wherein each of the first and second electrically conductive wire braids is coupled to the fabric using respective first and second electrically conductive threads stitched to the fabric and to the respective first and second electrically conductive wire braids.

8. The electronics assembly of claim 1 wherein each of the first and second electrically conductive wire braids comprises a plurality of electrically conductive wires.

9. The electronics assembly of claim 8 wherein each of the plurality of electrically conductive wires comprise a metal wire made of one or more of copper, silver, nickel and their alloys.

10. The electronics assembly of claim 8 wherein each of the plurality of electrically conductive wires comprise an electrically conductive plating finish.

11. The electronics assembly of claim 8 wherein each of the plurality of electrically conductive wires comprise an electrically conductive polymer.

12. The electronics assembly of claim 1 wherein each of the first and second electrically conductive wire braids comprises a plurality of electrically conductive wires braided together.

13. The electronics assembly of claim 1 further comprising an encapsulation layer coupled to the electronics component, the first and second electrically conductive wire braids and the first and second electrically conductive wires.

14. The electronics assembly of claim 1 wherein the electronics assembly is wearable.

15. The electronics assembly of claim 1 wherein each of the first and second electrically conductive wire braids comprises a first end coupled to and in contact with the respective first and second electrical connection points of the electronic component and a second end that is stitched to the fabric using the respective first and second electrically conductive wires, further wherein the first end is further coupled to the fabric.

16. The electronics assembly of claim 1 wherein each of the first and second electrical connection points is located within a footprint of the electronic component.

17. A method of making an electronics assembly, the method comprising:
   a. attaching a first electrical connection point of an electronic component in contact with a first electrically conductive wire braid, thereby forming a direct first electrical connection between the first electrically conductive wire braid and the first electrical connection point, and attaching a second electrical connection point of the electronic component in contact with a second electrically conductive wire braid, thereby forming a direct second electrical connection between the second electrically conductive wire braid and the second electrical connection point;
   b. attaching the first and second electrically conductive wire braids to a fabric, wherein the first electrically conductive wire braid is positioned between the fabric and the first electrical connection point, and the second electrically conductive wire braid is positioned between the fabric and the second electrical connection point;
   d. stitching a first electrically conductive wire to the fabric and to the first electrically conductive wire braid such that a first electrical connection is formed between the first electrically conductive wire and the first electrically conductive wire braid, wherein the first electrically conductive wire is stitched to the fabric and to the first electrically conductive wire braid without the first electrically conductive wire physically contacting the electronic component and the first electrical connection point, and stitching a second electrically conductive wire to the fabric and to the second electrically conductive wire braid such that a second electrical connection is formed between the second electrically conductive wire and the second electrically conductive wire braid, wherein the second electrically conductive wire is stitched to the fabric and to the second electrically conductive wire braid without the second electrically conductive wire physically contacting the electronic component and the second electrical connection point; and
   e. wherein each of the first and second electrically conductive wires comprises two separate wires, the two separate wires comprise a metal wire and an insulation wire each stitched to the fabric, further wherein the fabric comprises an insulated wire including an inner metal magnet wire and an outer insulation layer, and the first electrically conductive wire is electrically coupled to the inner metal magnet wire of the insulated wire.

18. The method of claim 17 wherein attaching each of the first and second electrical connection points to the respective first and second electrically conductive wire braids comprises soldering, welding or using an electrically conductive adhesive.

19. The method of claim 17 wherein attaching each of the first and second electrically conductive wire braids to the fabric comprises using an adhesive.

20. The method of claim 17 wherein attaching each of the first and second electrically conductive wire braids to the fabric comprises stitching first and second non-electrically conductive threads to the respective first and second electrically conductive wire braids and to the fabric.

21. The method of claim 17 wherein attaching each of the first and second electrically conductive wire braids to the fabric comprises stitching first and second electrically conductive threads to the respective first and second electrically conductive wire braids and to the fabric.

22. The method of claim 17 further comprising adding an encapsulation layer coupled to the electronics component, the first and second electrically conductive wire braids and the first and second electrically conductive wires.

23. The method of claim 17 wherein the electronics assembly is wearable.

24. The method of claim 17 wherein each of the first and second electrical connection points of the electronic component is attached to the respective first and second electrically conductive wire braids such that an interior side surface of each of the first and second electrical connection points of the electronic component is aligned with an interior side surface of the respective first and second electrically conductive wire braids and such that an exterior side surface of each of the first and second electrically conductive wire braids extends beyond a footprint of the electronic component.

* * * * *